(12) United States Patent
Pruett et al.

(10) Patent No.: US 9,694,541 B2
(45) Date of Patent: Jul. 4, 2017

(54) SELECTIVE COMPOSITE MANUFACTURING FOR COMPONENTS HAVING MULTIPLE MATERIAL PROPERTIES

(71) Applicant: RAYTHEON COMPANY, Waltham, MA (US)

(72) Inventors: James A. Pruett, Allen, TX (US); Travis Mayberry, Lewisville, TX (US); Fred H. Clairmont, Plano, TX (US); Earl E. Seymour, Allen, TX (US)

(73) Assignee: RAYTHEON COMPANY, Waltham, MA (US)

( * ) Notice: Subject to any disclaimer, the term of this patent is extended or adjusted under 35 U.S.C. 154(b) by 124 days.

(21) Appl. No.: 14/299,479

(22) Filed: Jun. 9, 2014

(65) Prior Publication Data

US 2015/0352786 A1    Dec. 10, 2015

(51) Int. Cl.
*B29C 67/00* (2017.01)
*B33Y 10/00* (2015.01)
(Continued)

(52) U.S. Cl.
CPC ...... *B29C 67/0077* (2013.01); *B29C 67/0051* (2013.01); *B29C 67/0066* (2013.01);
(Continued)

(58) Field of Classification Search
CPC ............ B29C 67/0051; B29C 67/0055; B29C 67/0062; B29C 67/0066; B29C 67/007;
(Continued)

(56) References Cited

U.S. PATENT DOCUMENTS 4,286,032 A * 8/1981 Ito .................. G03G 15/226
430/100
4,575,330 A   3/1986 Hull
(Continued)

FOREIGN PATENT DOCUMENTS

DE   102011089194 A1 * 6/2013 ............ B22F 3/1055
EP        0909793 A1    4/1999
(Continued)

OTHER PUBLICATIONS

PCT International Search Report and Written Opinion; International Application No. PCT/US2015/033213; International Filing Date: May 29, 2015; Date Mailed: Aug. 3, 2015, pp. 1-11.

*Primary Examiner* — Jeffrey Wollschlager
*Assistant Examiner* — Armand Melendez
(74) *Attorney, Agent, or Firm* — Cantor Colburn LLP

(57) ABSTRACT

A method of forming a component having multiple material properties includes forming, by additive manufacturing, a particle containment structure on a base layer; filling the particle containment structure with a first layer of particles, the layer of particles being contained by the particle containment structure; curing the first layer of particles; repeating the forming the particle containment structure, filling the particle containment structure with one or more additional layers of particles and curing the one or more additional layers of particles until a desired component dimension is achieved; forming, by additive manufacturing, a cover to encapsulate any exposed particles; and fully curing the particle containment structure, particles and cover.

20 Claims, 5 Drawing Sheets

(51) Int. Cl.
*G03F 7/00* (2006.01)
*G03F 7/20* (2006.01)
*B29K 105/00* (2006.01)

(52) U.S. Cl.
CPC ............ *B33Y 10/00* (2014.12); *G03F 7/0002*
(2013.01); *G03F 7/0037* (2013.01); *G03F 7/2018* (2013.01); *G03F 7/2049* (2013.01);
*B29K 2105/0005* (2013.01); *B29K 2105/251*
(2013.01); *Y10T 428/31504* (2015.04); *Y10T 428/31678* (2015.04)

(58) Field of Classification Search
CPC ............ B29C 67/0077; B29C 67/0074; B29C 70/688; B29C 33/3842; B29C 67/0059; B29C 67/0092; B29C 2033/385; B22F 3/008; B28B 1/001; G03F 7/0037; G03F 7/2049; G03F 7/0002; G03F 7/2018; B33Y 10/00; Y10T 428/31504; Y10T 428/31678; B29K 2105/0005; B29K 2105/251
USPC ....................................................... 430/100
See application file for complete search history.

(56) References Cited

U.S. PATENT DOCUMENTS

| | | | |
|---|---|---|---|
| 5,173,220 A | 12/1992 | Reiff et al. | |
| 5,216,616 A * | 6/1993 | Masters | B29C 35/08 156/272.8 |
| 5,236,812 A * | 8/1993 | Vassiliou | B29C 67/0066 430/269 |
| 5,653,925 A | 8/1997 | Batchelder | |
| 6,169,605 B1 * | 1/2001 | Penn | B29C 67/0059 358/1.1 |
| 6,391,251 B1 * | 5/2002 | Keicher | B05B 7/14 419/7 |
| 6,405,095 B1 * | 6/2002 | Jang | B29C 67/0081 264/308 |
| 7,229,586 B2 | 6/2007 | Dunlap et al. | |
| 2004/0099983 A1 * | 5/2004 | Dirscherl | B22F 3/008 264/162 |
| 2004/0187714 A1 * | 9/2004 | Napadensky | B29C 41/48 101/35 |
| 2006/0192315 A1 * | 8/2006 | Farr | B29C 67/0081 264/113 |
| 2007/0241482 A1 * | 10/2007 | Giller | B29C 67/0066 264/494 |
| 2014/0349132 A1 * | 11/2014 | Uhlmann | B22F 3/1055 428/596 |

FOREIGN PATENT DOCUMENTS

| | | | | |
|---|---|---|---|---|
| GB | WO 2012164015 A1 * | 12/2012 | ......... | B29C 67/0074 |
| WO | 9003893 A1 | 4/1990 | | |
| WO | 2009052120 A1 | 4/2009 | | |
| WO | 2013092123 A1 | 6/2013 | | |

* cited by examiner

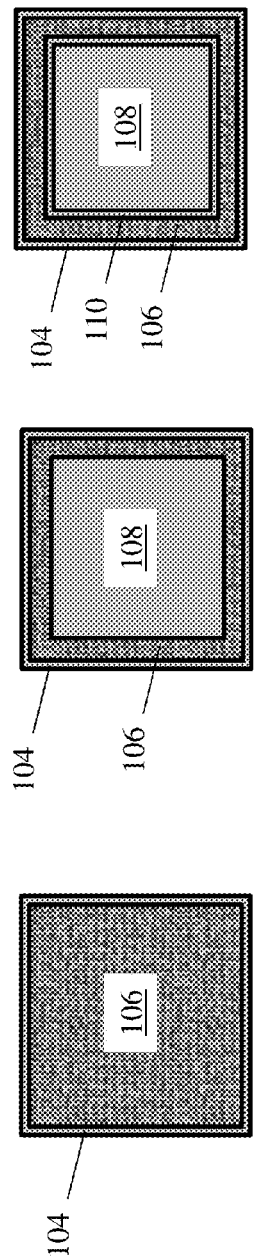

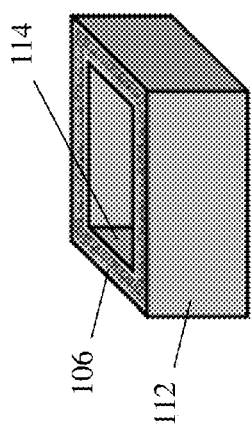
Figure 6
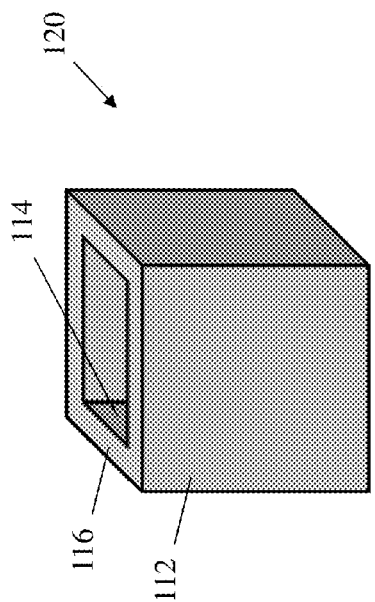
Figure 7
Figure 9
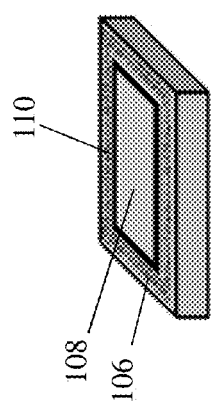
Figure 8

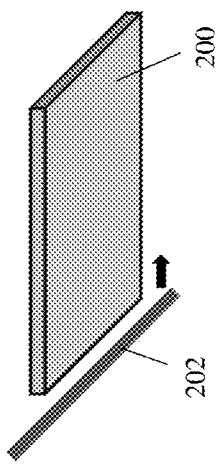
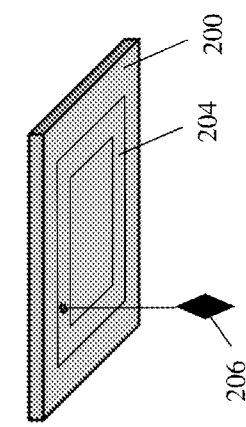
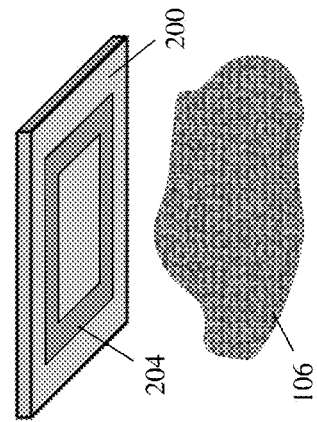
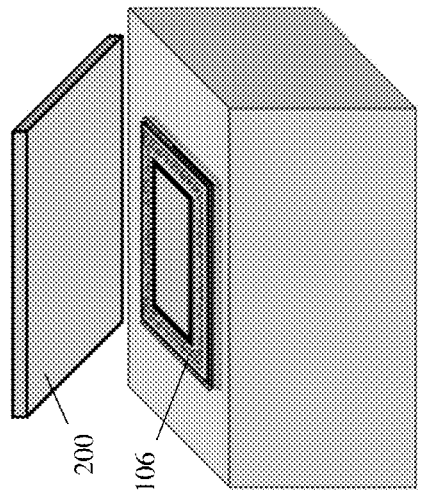
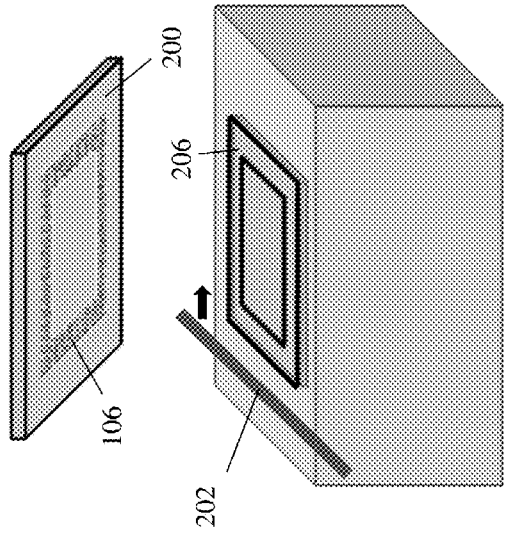

SELECTIVE COMPOSITE MANUFACTURING FOR COMPONENTS HAVING MULTIPLE MATERIAL PROPERTIES

BACKGROUND

The present disclosure relates generally to additive manufacturing (AM) techniques and, more particularly, to methods of implementing selective composite manufacturing for components having multiple material properties.

3D printing or AM is a process of making a three-dimensional solid object of virtually any shape from a digital model. 3D printing is achieved using an additive process, where successive layers of material are laid down in different shapes. 3D printing is also considered distinct from traditional machining techniques, which mostly rely on the removal of material by methods such as cutting or drilling (i.e., subtractive processes). A 3D printer is a limited type of industrial robot that is capable of carrying out an additive process under computer control.

Although 3D printing technology has been around since the 1980s, it was not until the early 2010s that the printers became widely available commercially. The first working 3D printer was created in 1984 by Chuck Hull of 3D Systems Corp. Since the start of the 21st century there has been a large growth in the sales of these machines, and their price has dropped substantially. Currently, 3D printing technology is used for both prototyping and distributed manufacturing with applications in architecture, construction (AEC), industrial design, automotive, aerospace, military, engineering, dental and medical industries, biotech (human tissue replacement), fashion, footwear, jewelry, eyewear, education, geographic information systems, food, and many other fields.

Stereolithography assembly (SLA) is one specific type of AM process which employs a vat of liquid ultraviolet curable photopolymer resin and an ultraviolet laser to build individual layers of the part one at a time. For each layer, the laser beam traces a cross-section of the part pattern on the surface of the liquid resin. Exposure to the ultraviolet laser light cures and solidifies the pattern traced on the resin and joins it to the layer below. After the pattern has been traced, an elevator platform of the part descends by a distance equal to the thickness of a single layer, for example about 0.05 mm to 0.15 mm (0.002" to 0.006"). Then, a resin-filled blade sweeps across the cross section of the part, re-coating it with fresh material. On this new liquid surface, the subsequent layer pattern is traced, joining the previous layer. A complete 3D part is thus formed by this process. After being built, parts are immersed in a chemical bath in order to be cleaned of excess resin and are subsequently cured in an ultraviolet or conventional oven.

SUMMARY

In an exemplary embodiment, a method of forming a component having multiple material properties includes forming, by additive manufacturing, a particle containment structure on a base layer; filling the particle containment structure with a first layer of particles, the layer of particles being contained by the particle containment structure; curing the first layer of particles; repeating the forming the particle containment structure, filling the particle containment structure with one or more additional layers of particles and curing the one or more additional layers of particles until a desired component dimension is achieved; forming, by additive manufacturing, a cover to encapsulate any exposed particles; and fully curing the particle containment structure, particles and cover.

In another embodiment, a structure having multiple material properties, includes a plurality of cured layers, each cured layer comprising a particle containment structure formed on a base layer, the particle containment structure with a layer of particles, the layer of particles being contained by the particle containment structure; and a cover that encapsulates any exposed particles.

BRIEF DESCRIPTION OF THE DRAWINGS

For a more complete understanding of this disclosure, reference is now made to the following brief description, taken in connection with the accompanying drawings and detailed description, wherein like reference numerals represent like parts:

FIGS. 1-9 illustrate a method of forming a component with multiple material properties, in accordance with an exemplary embodiment, in which:

FIG. 1 is a perspective view of an exterior polymer base formed by UV curing, in accordance with AM techniques;

FIG. 2 is a top view of an outer dam formed by curing the polymer at the perimeter of the exterior polymer base;

FIG. 3 is a top view of a lower particle layer formed over the exterior polymer base, and constrained by the dam;

FIG. 4 is a top view of an interior polymer base layer formed by UV curing of a fresh polymer layer;

FIG. 5 is a top view of an inner dam is formed by curing polymer at the perimeter of the interior polymer base, and the height of the outer dam built up to match the height of the inner dam;

FIG. 6 is a perspective view of the structure shown in FIG. 5;

FIG. 7 is a perspective view of the structure shown in FIG. 6, after further iterations of dam formation and particle fill;

FIG. 8 is a perspective view of the structure shown in FIG. 7, after further iterations of dam formation and particle fill;

FIG. 9 is a perspective view of the structure shown in FIG. 8, after a polymer cover is cured over the exposed particle material and between the outer and inner walls;

FIGS. 10-14 are a series of perspective views illustrating the use of laser printer techniques to perform the particle material fill between the dams, in accordance with an exemplary embodiment, in which:

FIG. 10 illustrates a photosensitive, silicon coated plate charged to approximately +600 VDC by passing a corona wire over the surface;

FIG. 11 illustrates writing an image is written on the plate with a high voltage laser;

FIG. 12 illustrates the photosensitive plate lowered over positive-charged particles to electrostatically attract the particles to the image imprinted on the bottom surface of the plate;

FIG. 13 illustrates an uncured polymer layer is charged to approximately +600 VDC via a corona wire, with the plate having the negatively-charged particle image then lowered over the uncured polymer layer in order to transfer the particles to surface of the polymer between the dams;

FIG. 14 illustrates the transfer of the particles into the polymer;

FIGS. 15 and 16 are perspective views illustrating the use of pen deposition techniques to perform the particle material fill between the dams, in accordance with an exemplary embodiment, in which:

FIG. 15 illustrates the formation of new layer of polymer over a cured outside layer and a dam around the perimeter of the areas that will receive particles;

FIG. 16 illustrates a particle dispensing pen positioned over the particle image area to dispense the particles into the surface of the polymer between the dams.

DETAILED DESCRIPTION

Figure 16:
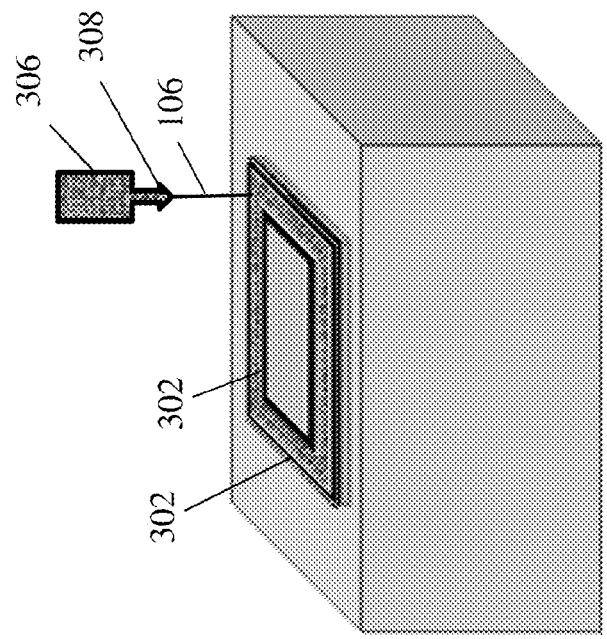

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature(s) being described. Also, the description is not to be considered as limiting the scope of the embodiments described herein.

Advanced composite materials are generally characterized or determined by having unusually high strength fibers with unusually high stiffness, or modulus of elasticity characteristics, as compared to other materials, while bound together by weaker matrices. These materials are thus termed "advanced" composite materials (ACMs), in comparison to composite materials more commonly in use, such as reinforced concrete, or even the concrete itself. The high strength fibers of ACMs are also low density while occupying a large fraction of the volume.

Advanced composites exhibit desirable physical and chemical properties that include light weight coupled with high stiffness, toughness, and strength along the direction of the reinforcing fiber, dimensional stability, temperature and chemical resistance, flex performance, and relatively easy processing. Advanced composites are replacing metal components in many uses, particularly in the aerospace industry.

Composites are classified according to their matrix phase. These classifications include polymer matrix composites (PMC), ceramic matrix composites (CMC), and metal matrix composites (MMC). Also, materials within these categories are often called "advanced" if they combine the properties of high (axial, longitudinal) strength values and high (axial, longitudinal) stiffness values, with low weight, corrosion resistance, and in some cases special electrical properties. Advanced composite materials have broad, proven applications, in the aircraft, aerospace, and sports equipment sectors.

With respect to the manufacture of composite parts, two problems in this regard include a high expense and prolonged schedule, particularly if there are design iterations. In turn, contributing factors to the high expense and prolonged schedule include: tooling; tooling changes caused either by error or design iterations; complex machinery; highly trained operators; and successive steps in the manufacturing flow. In addition, another problem associated with the manufacturing of a composite part may include the incorporation of different material properties in specific areas.

On the one hand, utilizing an AM approach such as SLA (as discussed above) can solve the high expense and prolonged schedule problems, assuming a polymer part can meet all performance requirements. However, if there are performance requirements, such as for example increased strength, higher conductivity, lower weight, enhanced armor characteristics, etc., then a conventional SLA technique will not work since the incorporation of multiple material properties within a same part has not been achieved heretofore by simply utilizing SLA.

Accordingly, embodiments disclosed herein incorporate various material-matrices into AM techniques (e.g., using SLA and/or pen deposition) combined with precision material insertion (e.g., using laser printing and/or pen deposition) to form selective composite parts. In the case of AM, the part to be built is sliced (in a computer) into a series of layers that is then cured in an exact pattern one layer at a time, until the finished product is complete. Here, each layer of resin or polymer may contain specific particles such as, for example, fibers, flakes, spheres, microspheres, powder, etc. The type of material may include glass and/or carbon fibers, metal and/or metal combination particles, including aluminum, copper, steel, titanium, tungsten, silver, gold, nickel, tin, zinc, manganese dioxide, silver-oxide, etc., and/or ceramic, plastic, polymer, and/or glass particles. The particles may be plated or treated prior to inclusion into the part. In addition, each layer of particles may be a singular type of particle, a mixture, or several different independent types of particles. The pattern of each type of particle is put into the layer to be cured similar to a printer applying images of different color inks in exact patterns.

The part composition is selectable for specific areas within a part. The material matrix chosen could be for increased strength, higher conductivity, lower weight, enhanced armor characteristics, or other means of improved performance. One common AM process has a polymer (e.g., an epoxy such as Somos™ WaterShed XC 11122) and a photo initiator that utilizes a UV (ultraviolet) laser for curing, and can be thermally baked to achieve a full cure. Exemplary applications for this particular AM technology include, but are not limited to: printed wiring boards (PWBs), ground planes, EMI shielding, high strength areas, busbars, lightweight areas, tailored armor and protective equipment shapes and architectures, radomes, integral capacitors, matched coefficient of thermal expansion (CTE) areas, etc.

Generally stated, there are two sub-processes that are implemented in embodiments herein to manufacture a composite part that has selective areas of added particles. First, there is the formation of a particle containment structure (also referred to as a dam herein) that is used to contain subsequently formed particles therein. This is followed by the selective fill of the particles within the particle containment structure. The dams (having exemplary wall thicknesses of, for example, up to about 0.020 inches or 0.508 millimeters (mm)) are formed around the perimeter of the area(s) that will receive particles, and provide a corral for containment of particles prior to curing of the polymer. Essentially, the dams form an inner and outer mold for each layer and create an inner and outer polymer skin on the completed part that will ensure that the final product will not have exposed particles. However, it will be appreciated that if required, parts of these skins may be treated as sacrificial and post-machined, burned, or etched away in specific areas.

In the case of SLA, a dam is created by curing a path in the fresh polymer layer. In the case of pen deposition, the pen dispenses the dam material and the material is UV cured as it is dispensed. The thixotropic property of the dam material is set to allow flow out of the nozzle but also to keep the dam in shape and in place until it is cured. If a wall with no vertical contours is desired, a shaped nozzle on the dispensing pen may be used. For instance, the shaped nozzle may be square to obtain a square extrusion out of the nozzle for the dam.

Upon formation of the dam, the next step is to apply the pattern of each type of desired particle into the layer to be cured, similar to a printer applying images of different color inks in exact patterns. Once the pattern is blown into the polymer layer, the layer is cured. These processes are repeated until the product is finished. In the specific example of using AM to manufacture a PWB, the dams enable the application of thin layers of dielectric materials that are free of pinholes, free from air pockets between conductors, and the creation of flat dielectric surfaces for uninterrupted writing of conductors.

As described in additional detail below, four examples are provided for manufacturing a composite part that has selective areas of added particles. A first embodiment utilizes a combination of SLA and laser printing technologies. A second embodiment utilizes a combination of SLA and pen deposition technologies. A third embodiment utilizes a combination of pen deposition and laser printing technologies, and a fourth embodiment involves the application of pen deposition technology utilizing at least two viscosities of polymer.

Referring now to FIGS. 1-9, there is shown a series of top and perspective views illustrating a method of forming a component with multiple material properties. In the exemplary embodiment depicted, SLA techniques are used to prepare the fill containment structures or dams of the component. The filling of particles within the dams shown in FIGS. 1-9 may be done by either laser printing or pen deposition techniques as described in further detail hereinafter.

As shown in FIG. 1, an exterior polymer base 102 is formed by UV curing, in accordance with SLA techniques (or, alternatively, by pen deposition) as known in the art. Then, as shown in FIG. 2, SLA prepares a new layer of polymer over the cured exterior polymer base 102 and thereafter defines a vertical, outer dam 104 by curing the polymer at the perimeter of the exterior polymer base 102. As indicated above, an exemplary wall thickness of the outer dam 104 may be up to about 0.020 inches/0.508 mm. (It should be noted at this point, if a pen deposition technique is instead used to create the outer dam 104, the pen would dispense the dam material with the material being UV cured as it is dispensed.)

At this point in the manufacturing process, it is intended that the exterior polymer base 102 be covered with particles, thus inner dams are not yet created. Proceeding to FIG. 3, a lower particle layer 106 is formed over the exterior polymer base 102, and is constrained by the dam 104. The lower particle layer 106 is then subjected to a UV cure so that it is at least partially set. The processes in FIGS. 2 and 3 may then be repeated as necessary (i.e., outer dam build up and particle fill/cure) to increase the height of the outer dam 104 and the lower particle layer 106 to a desired level.

Referring now to FIG. 4, an interior polymer base layer 108 is formed by UV curing of a fresh polymer layer, in accordance with SLA techniques. As can be seen, the interior polymer base layer 108 does not completely cover the filled particle layer 106. Then, in FIG. 5, an inner dam 110 is formed by curing polymer at the perimeter of the interior polymer base 108. In addition, the height of outer dam 104 is also correspondingly built up to match the height of the newly formed inner dam 110. The outer and inner dams 104, 110 are thus able to accommodate additional particle layer 106 fill therebetween.

Referring now to the perspective views of FIGS. 6-8, it may now be seen how repeated instances of the process performed in FIG. 5 results in a part having particles encapsulated between inner and outer walls. As the outer and inner dams 104, 110 are continually built up with particle material 106 formed therebetween, they eventually define outer and inner walls 112, 114, respectively, of the part as shown in FIGS. 7 and 8. With each additional iteration of forming new dams, the previously formed portions of the structure may be considered a base layer for the new dams. It should also be noted at this point that the particle material 106 may be varied as desired at each iteration of the process to form selective composite parts.

In FIG. 9, once the desired dimension (e.g., height, thickness, etc.) of the part is achieved, a polymer cover 116 is cured over the exposed particle material 106 and between the outer and inner walls 112, 114. An oven bake may be performed until the entire part is fully cured. Thus formed, the resulting selective composite part 120 has particle/polymer matrix layers inside the bottom and walls thereof. Through the use of the dam formation and subsequent particle fill operation, a "corral" for the containment of particles prior to curing of resin is provided and, in addition, the final product does not have exposed particles. In the alternative, it is contemplated that the cured particles may also constitute the final exterior surface. In other words, the exterior particle containment structure can be selected to be a sacrificial material such that it is removed following the oven bake (full cure) operation, leaving only the cured particle fill materials. Removal of such material may be implemented in any suitable manner known in the art, such as by chemical removal, etching, mechanical removal, etc.

As mentioned above, one suitable technique for the application of the particle material 106 between the dams is through laser printer technology. FIGS. 10-14 are further illustrative in this regard. In particular, FIG. 10 depicts a photosensitive, silicon coated plate 200 that is charged to approximately +600 VDC by, for example, passing a corona wire 202 over the surface. The plate 200 is able to hold the positive charge because of a photo-charging layer present underneath the silicon. As shown in FIG. 11, an image 204 is written on the plate 200 through the use of a high voltage laser 206 that is moved across the plate 200 in a strobe-like manner until the entire particle image from the SLA slice is "written" with a negative charge onto the bottom of the photosensitive plate 200. The laser 206 also neutralizes the positive charge for any non-image space such that the particles 106 will be only attracted to the regions of the plate 200 that make up the image 204.

If the particles 106 to be applied are conductive, then a flat tray (not shown) containing the particles may be charged to approximately +600 VDC by charging the tray itself. On the other hand, if the particles to be applied are non-conductive, then the particles in the flat tray may be charged to approximately +600 VDC by passing a corona wire over the surface. As depicted in FIG. 12, the photosensitive plate 200 with the negative-charged particle image 204 defined thereon is lowered over the flat tray of positive-charged particles 106 such that the particles 106 are attracted electrostatically to the image 204 imprinted on the bottom surface of the plate 204. The negative voltage on the image 204 is high enough so that the particle image is still negatively charged.

Proceeding to FIG. 13, a new uncured polymer layer 206 is charged to approximately +600 VDC via a corona wire 202. The plate 200 with the negatively-charged particle image is then lowered over the uncured polymer layer 206 so that the negative image is "blown" into the surface of the polymer between the dams. In exemplary embodiments, it is desirable to partially submerge the particles 106 into the polymer 206 so that there is a "tooth" exposed above the top of the resin to aid in connecting with the next layer of resin/particles. In addition, to overcome edge effects around the particle image, the positive charge on the polymer 206 is higher than the neutral-to-slightly positive charge on the non-image portion of the plate 200. The transfer of the particles 106 into the polymer 206 is shown in FIG. 14. Any remaining charge on the plate 200 may then be removed by a discharge lamp that erases the electrostatic image 204.

Following the particle transfer, a UV cure is applied to the polymer between the dams so that the polymer will have at least a partial set, as described above. As also indicated above, the SLA process prepares a new layer of polymer, encapsulating the portion of the particles that are sticking out of the partially-cured resin. The operations are repeated until all particle images are complete and then a final layer is cured over the particle area(s). The part is then baked (relying on the thermal initiator) to ensure completion of the polymer cure.

Figure 15:
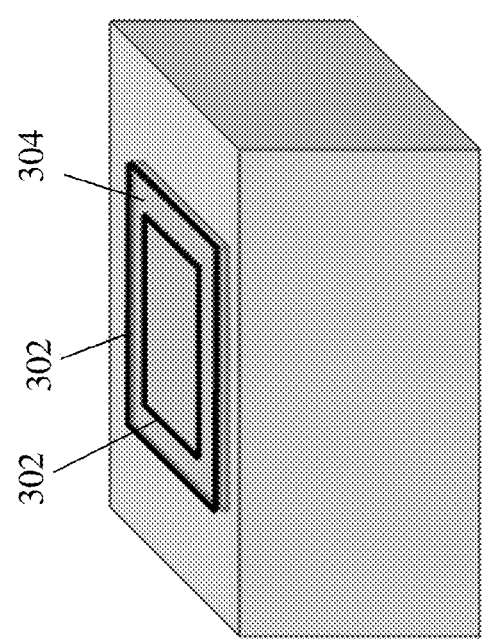

Referring now to FIGS. 15 and 16, in an alternative embodiment, instead of using laser printer technology, particle transfer may also be implemented using pen deposition technology. As is the case with the laser printer technology embodiment, an AM technique (e.g., SLA) is first used to prepare a new layer of polymer over a cured outside layer and to cure a dam 302 around the perimeter of the area(s) 304 that will receive particles, as shown in FIG. 15. In a case where pen deposition is used to create the dams, the pen (not shown in FIG. 15) dispenses the dam material and the material is UV cured as it is dispensed. A nozzle (not shown in FIG. 15) associated with the pen may be shaped to create a specific shape of extruded material for pen deposition.

Then, in FIG. 16, a particle dispensing pen 306 having a nozzle 308 is positioned over the particle image area and dispenses the particles 106 into the surface of the polymer between the dams 202. Similar to the laser printer embodiment, it is desirable to partially submerge the particles 106 into the polymer so that there is a "tooth" or portion of particle materials exposed above the top of the polymer to aid in connecting with the next layer of polymer/particles. The particle filled polymer between the dams is UV cured so that the polymer will have at least a partial set. This is followed by repetition of the operations shown in FIGS. 15 and 16 until all particle images are complete and then a final layer is cured over the particle area(s) (such as was shown in FIG. 9, for example). The resulting part is then baked (relying on the thermal initiator) to ensure completion of the polymer cure. Optionally, the polymer particle containment structure material may be removed at this point, if selected to be a sacrificial material.

Figure 17:
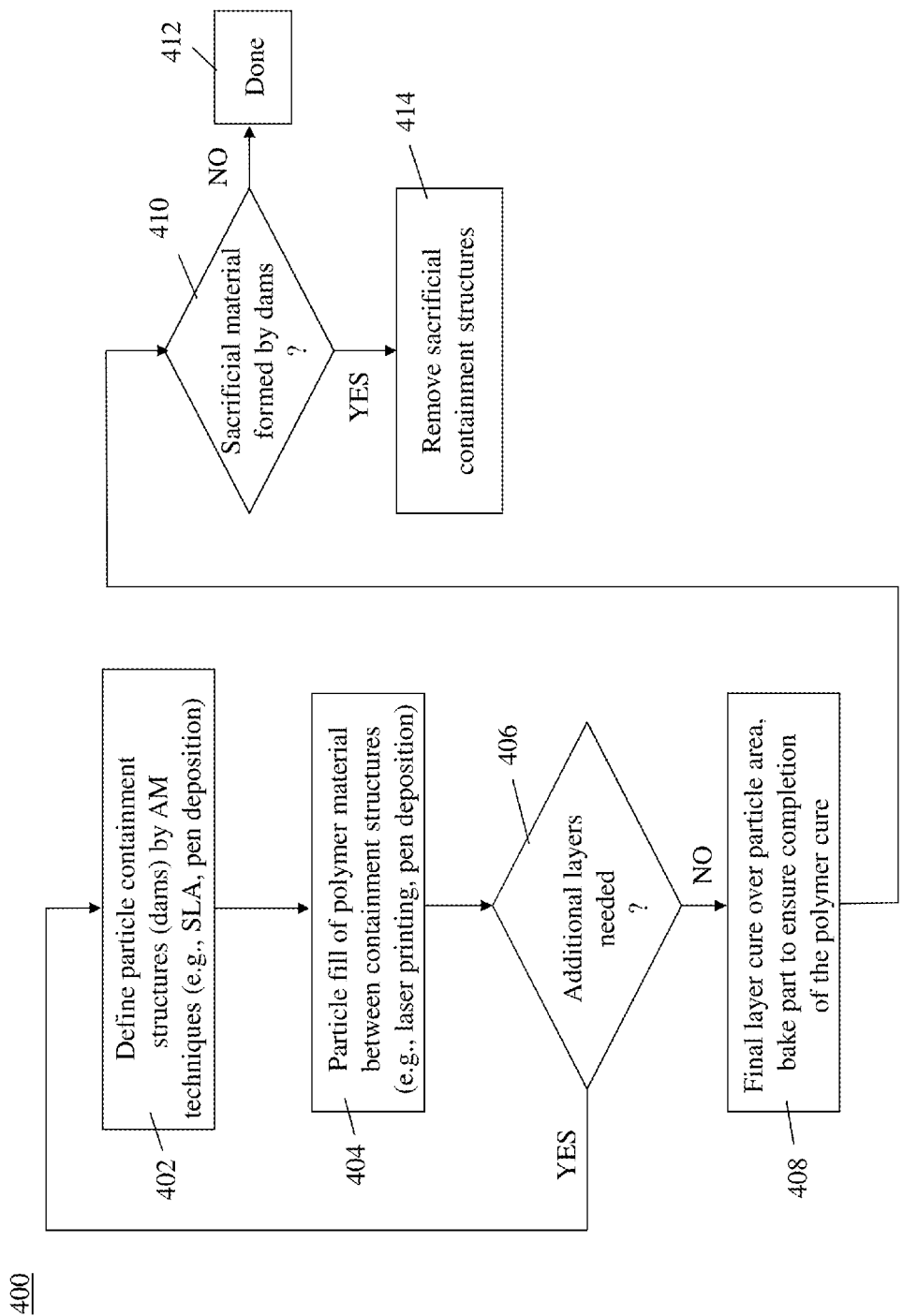
FIG. 17 is a high-level flow diagram illustrating a method for selective composite manufacturing of components having multiple material properties, in accordance with an exemplary embodiment.

In summary, FIG. 17 is a high-level flow diagram 400 illustrating an overall two-step approach for selective composite manufacturing of components having multiple material properties, as described in more detail above. Block 402 illustrates the formation, via AM techniques, of a particle containment structure (dam) that is used to contain subsequently formed particles therein. Exemplary embodiments as described above in forming the dams include SLA and pen deposition techniques as known in the art. Once the dams are formed, a particle fill technique is then applied to fill particles between the dams as shown in block 404. Exemplary particle fill techniques in this regard may include laser printing techniques and pen deposition techniques.

At decision block 406, if additional layers are needed as the part is being assembled, the process returns to block 402 for additional buildup of the dams via AM techniques. Additional particle fill is performed in block 404, where it should be noted again that depending upon the location in the part, different particle fill materials may be used within the same layer. Once additional layers are no longer needed, the process proceeds to block 408 for forming a final layer that is cured over the particle area, and thereafter baking the part to ensure completion of the polymer cure. Decision block 410 reflects the optional sacrificial layer feature, such that in the event the dams are not a sacrificial material, the process ends at block 412. On the other hand, if the dams are a sacrificial material, the sacrificial containment structures are removed at block 414.

As will thus be appreciated, the embodiments described herein offer several advantages with respect to more conventional manufacturing techniques. For example, material properties may be tailored for a specific need and to a specific location within a product. Because material types do not have to be uniform throughout the product, multiple material properties can therefore be present in the same product. In addition, a part may be set up and run without personnel supervision. A product may also be manufactured in a lab, without tooling, and directly from a CAD (Computer Aided Design) database. Consequently, design changes for a part may be implemented without a corresponding tooling change. Exemplary applications and products produced by the above described techniques include ground planes, EMI shielding, high strength areas, busbars, lightweight areas, tailored armor and protective equipment shapes and architectures, radomes, integral capacitors, matched CTE areas, etc.

While the disclosure has been described with reference to a preferred embodiment or embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

The invention claimed is:

1. A method of forming a component having multiple material properties, the method comprising:
   forming, by additive manufacturing, a first particle containment structure on a first base layer;
   filling the first particle containment structure with a first layer of particles, the layer of particles being contained by the first particle containment structure;
   curing the first layer of particles;
   forming a second particle containment structure on a second base layer within the first particle containment structure and on the cured first layer of particles,
   increasing respective heights of the first and second particle containment structures;
   filling space between the first and second particle containment structures with one or more additional layers of particles and curing the one or more additional layers of particles until a desired component dimension is achieved;
   forming, by additive manufacturing, a cover to encapsulate any exposed particles; and fully curing the first and second particle containment structure, the particles and the cover.

2. The method of claim 1, wherein the first and second particle containment structures are formed by stereolithography assembly.

3. The method of claim 1, wherein the first and second particle containment structures are formed by pen deposition techniques.

4. The method of claim 1, wherein filling of the space between the first and second particle containment structures is performed by laser printing techniques.

5. The method of claim 1, wherein filling of the space between the first and second particle containment structures is performed by pen deposition techniques.

6. The method of claim 1, wherein the first and second particle containment structures each comprises a dam formed by curing a polymer material.

7. The method of claim 6, wherein the dam has a wall thickness of up to about 0.020 inches.

8. The method of claim 1, wherein the first layer of particles and the one or more additional layers of particles comprises one of more of: fibers, flakes, spheres, microspheres, and powder.

9. The method of claim 8, wherein the first layer of particles and the one or more additional layers of particles comprises one of more of: glass fibers, carbon fibers, metal particles, metal combination particles, aluminum, copper, steel, titanium, tungsten, silver, gold, nickel, tin, zinc, manganese dioxide, silver oxide, ceramic particles, plastic particles, polymer particles, and glass particles.

10. The method of claim 1, wherein the first and second particle containment structures each comprises a UV cured polymer material.

11. The method of claim 2, wherein the forming of the first and second particle containment structures further comprises:
    UV curing a polymer base;
    preparing a new layer of polymer over the cured polymer base and thereafter curing the new layer polymer at the perimeter of the polymer base so as to define a vertical dam.

12. The method of claim 3, wherein the forming of the first and second particle containment structures further comprises dispensing, with a dispensing pen, a dam material over a cured polymer base and UV curing dam material during the dispensing so as to define a vertical dam, and wherein a nozzle of the dispensing pen is shaped to create a desired shape of extruded dam material.

13. The method of claim 4, wherein the filling of the space between the first and second particle containment structures further comprises:
    charging a photosensitive plate to a first polarity;
    writing an image on a surface of the photosensitive plate using a laser to impart a charge of a second, opposite polarity on portions of the photosensitive plate;
    charging the particles to the first polarity;
    attracting the charged particles to the image, wherein the image remains at the second polarity;
    charging one of the first and second particle containment structures to the first polarity; and
    transferring the particles from the image to one of the first and second base layers, the particles being contained by the one of the first and second particle containment structures.

14. The method of claim 13, wherein the transferring the particles from the image to the one of the first and second base layers partially submerges the particles into the base such that there is a portion of particle materials exposed above a top of the one of the first and second base layers.

15. The method of claim 5, wherein the filling of the space between the first and second particle containment structures further comprises dispensing, with a dispensing pen, the particles onto one of the first and second base layers, the particles being contained by the first and second particle containment structures.

16. The method of claim 1, wherein the first and second particle containment structures and cover are sacrificial materials, and further comprising removing the first and second particle containment structures and cover following the fully curing.

17. The method of claim 1, wherein the first and second particle containment structures have same shapes,
    the second particle containment structure being a hollowed polygonal shape nested within the first particle containment structure, which is a hollowed polygonal shape.

18. The method of claim 1, wherein the first particle containment structure comprises a polygonal dam having first width and depth dimensions, the second particle containment structure comprises a polygonal dam having second width and depth dimensions and the second width and depth dimensions being less than the first width and depth directions.

19. The method of claim 18, wherein each of the first and second particle containment structures is a four-sided and four cornered dam.

20. The method of claim 18, wherein a height of the second particle containment structure is a same height of the first particle containment structure less a thickness of the cured first layer of particles and less a thickness of the second base layer.

* * * * *